(12) United States Patent
Jeon (10) Patent No.: US 12,327,593 B2
(45) Date of Patent: Jun. 10, 2025

(54) MEMORY DEVICE AND OPERATING METHOD OF THE MEMORY DEVICE

(71) Applicant: SK hynix Inc., Icheon-si (KR)

(72) Inventor: Nam Cheol Jeon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 250 days.

(21) Appl. No.: 18/078,620

(22) Filed: Dec. 9, 2022

(65) Prior Publication Data

US 2024/0038304 A1 Feb. 1, 2024

(30) Foreign Application Priority Data

Aug. 1, 2022 (KR) .................. 10-2022-0095615

(51) Int. Cl.
| | |
|---|---|
| *G11C 8/00* | (2006.01) |
| *G11C 16/04* | (2006.01) |
| *G11C 16/08* | (2006.01) |
| *G11C 16/30* | (2006.01) |
| *G11C 16/34* | (2006.01) |

(52) U.S. Cl.
CPC .......... *G11C 16/08* (2013.01); *G11C 16/0433* (2013.01); *G11C 16/30* (2013.01); *G11C 16/3404* (2013.01)

(58) Field of Classification Search
CPC ..... G11C 16/08; G11C 16/0433; G11C 16/30; G11C 16/3404
USPC .................................................. 365/230.06
See application file for complete search history.

(56) References Cited

U.S. PATENT DOCUMENTS

| | | | | | |
|---|---|---|---|---|---|
| 5,886,923 | A | * | 3/1999 | Hung ..................... | G11C 16/08 365/185.11 |
| 5,978,263 | A | * | 11/1999 | Javanifard ............. | G11C 16/16 365/185.11 |
| 5,991,198 | A | * | 11/1999 | Song ...................... | G11C 16/08 365/185.11 |
| 5,999,479 | A | * | 12/1999 | Park ...................... | G11C 16/08 365/230.06 |
| 6,134,141 | A | * | 10/2000 | Wong .................... | G11C 7/1039 365/185.25 |

(Continued)

FOREIGN PATENT DOCUMENTS

| | | |
|---|---|---|
| KR | 1020200109820 A | 9/2020 |
| KR | 1020220015245 A | 2/2022 |

*Primary Examiner* — Viet Q Nguyen
(74) *Attorney, Agent, or Firm* — WILLIAM PARK & ASSOCIATES LTD.

(57) ABSTRACT

Embodiments of the present disclosure relate to a memory device, and an operating method of the memory device. The memory device includes a first memory block and a second memory block each including a plurality of memory cells. The memory device also includes a voltage generator for applying operating voltages to first global lines, selectively applying a positive voltage to global select lines included in second global lines while the operating voltages are applied, and applying a ground voltage to the other global lines except the global select lines among the second global lines. The memory device further includes a row decoder for turning on first pass switches between first local lines connected to the first memory block and the first global lines, and turning off second pass switches between second local lines connected to the second memory block and the second global lines.

24 Claims, 10 Drawing Sheets

(56) References Cited

U.S. PATENT DOCUMENTS

| | | | |
|---|---|---|---|
| 8,391,043 B2 * | 3/2013 | Shim | G11C 7/18 |
| | | | 365/185.11 |
| 8,614,923 B2 * | 12/2013 | Macerola | G11C 11/5642 |
| | | | 365/205 |
| 8,724,412 B2 * | 5/2014 | Yoo | G11C 8/08 |
| | | | 365/226 |
| 8,897,068 B2 * | 11/2014 | Kim | G11C 16/3418 |
| | | | 365/185.11 |
| 9,007,834 B2 * | 4/2015 | Rhie | G11C 11/5635 |
| | | | 365/185.11 |
| 9,293,181 B2 * | 3/2016 | Koo | G11C 16/0483 |
| 9,299,447 B2 * | 3/2016 | Lee | G11C 16/28 |
| 9,336,883 B2 * | 5/2016 | Lee | G11C 16/32 |
| 9,384,841 B2 * | 7/2016 | Shim | G11C 5/063 |
| 9,419,007 B2 * | 8/2016 | Kwon | H10B 41/27 |
| 9,558,835 B2 * | 1/2017 | Lee | G11C 16/08 |
| 9,627,079 B1 * | 4/2017 | Hong | G11C 16/3409 |
| 10,269,909 B1 * | 4/2019 | Yang | H10B 41/40 |
| 10,741,248 B2 * | 8/2020 | Sung | G11C 16/08 |
| 10,892,022 B1 * | 1/2021 | Kavalipurapu | G11C 16/3427 |
| 11,004,516 B2 | 5/2021 | Xu | |
| 11,056,176 B2 * | 7/2021 | Shin | G11C 11/409 |
| 11,282,583 B2 * | 3/2022 | Kim | G11C 16/08 |
| 11,328,761 B2 * | 5/2022 | An | G11C 16/34 |
| 11,615,835 B2 * | 3/2023 | Lee | G11C 8/12 |
| | | | 365/185.2 |
| 2019/0006021 A1 * | 1/2019 | Ghai | G11C 11/5628 |

\* cited by examiner

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2022-0095615, filed on Aug. 1, 2022, in the Korean Intellectual Property Office, the entire disclosure of which is incorporated herein by reference.

BACKGROUND

1. Technical Field

The present disclosure generally relates to a memory device and an operating method of the memory device, and more particularly, to a memory device configured to perform a program operation and an operating method of the memory device.

2. Related Art

A memory device may include a memory cell array in which data is stored; a peripheral circuit configured to perform a program, read, or erase operation; and control logic configured to control the peripheral circuit.

The memory cell array may include a plurality of memory blocks, and each of the plurality of memory blocks may include a plurality of memory cells. The memory device may be implemented as a two-dimensional structure or a three-dimensional structure.

In a memory device implemented as a two-dimensional structure, memory cells may be arranged in a direction parallel to a substrate. Because the memory cells are arranged parallel to the substrate, a channel of the memory cells may be formed of single crystalline silicon.

In a memory device implemented as a three-dimensional structure, memory cells may be stacked in a direction perpendicular to a substrate. Because the memory cells are stacked above the substrate, a channel of the memory cells may be formed of poly-crystalline silicon. The poly-crystalline silicon is configured with a plurality of grains, and therefore, boundaries of the grains may become trap sites. When a trap site is filled with a hole, the channel may become a donor-like state. A channel potential may be increased to a positive level. Such a phenomenon may occur in unselected memory blocks while a program operation is performed in a selected memory block. When channel boosting occurs in the unselected memory blocks, a subsequent operation which may be performed in the unselected memory blocks may be influenced, and therefore, the reliability of the memory device may be degraded.

SUMMARY

Some embodiments provide a memory device and an operating method of the memory device, in which channel boosting can be suppressed in unselected memory blocks during a program operation of a selected memory block.

In accordance with an embodiment of the present disclosure, a memory device includes: a first memory block and a second memory block each including a plurality of memory cells; a voltage generator configured to apply operating voltages to first global lines, selectively apply a positive voltage to global select lines included in second global lines while the operating voltages are applied, and apply a ground voltage to the other global lines except the global select lines among the second global lines; and a row decoder configured to turn on first pass switches between first local lines connected to the first memory block and the first global lines and configured to turn off second pass switches between second local lines connected to the second memory block and the second global lines.

In accordance with another embodiment of the present disclosure, a memory device includes: a first memory block and a second memory block each including a plurality of memory cells; a voltage generator configured to apply operating voltages to first global lines, selectively apply a positive voltage to global select lines included in second global lines while the operating voltages are applied, and apply a ground voltage to the other global lines except the global select lines among the second global lines; and a row decoder configured to apply a first block select signal having a high voltage to first pass switches between first local lines connected to the first memory block and the first global lines, and selectively apply a negative voltage to second pass switches between second local lines connected to the second memory block and the second global lines.

In accordance with a further embodiment of the present disclosure, a method of operating a memory device includes: turning on first pass switches between first local lines connected to a first memory block and first global lines; turning off second pass switches between second local lines connected to a second memory block and second global lines; applying a program voltage to a selected global word line among the first global lines; applying a positive voltage to global select lines among the second global lines, when the program voltage is applied to the selected global word line; and applying a negative voltage to gates of the second pass switches, when the program voltage is applied to the selected global word line.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural and functional descriptions disclosed herein are merely illustrative for the purpose of describing embodiments according to the concept of the present disclosure. Additional embodiments according to the concept of the present disclosure can be implemented in various forms. Thus, the present disclosure should not be construed as being limited to the embodiments set forth herein.

Hereinafter, it will be understood that, although the terms "first," "second," etc. may be used herein to describe various elements, but these elements should not be limited by these terms. These terms are only used to distinguish one element from another element and not to imply a number or order of elements.

Figure 1:
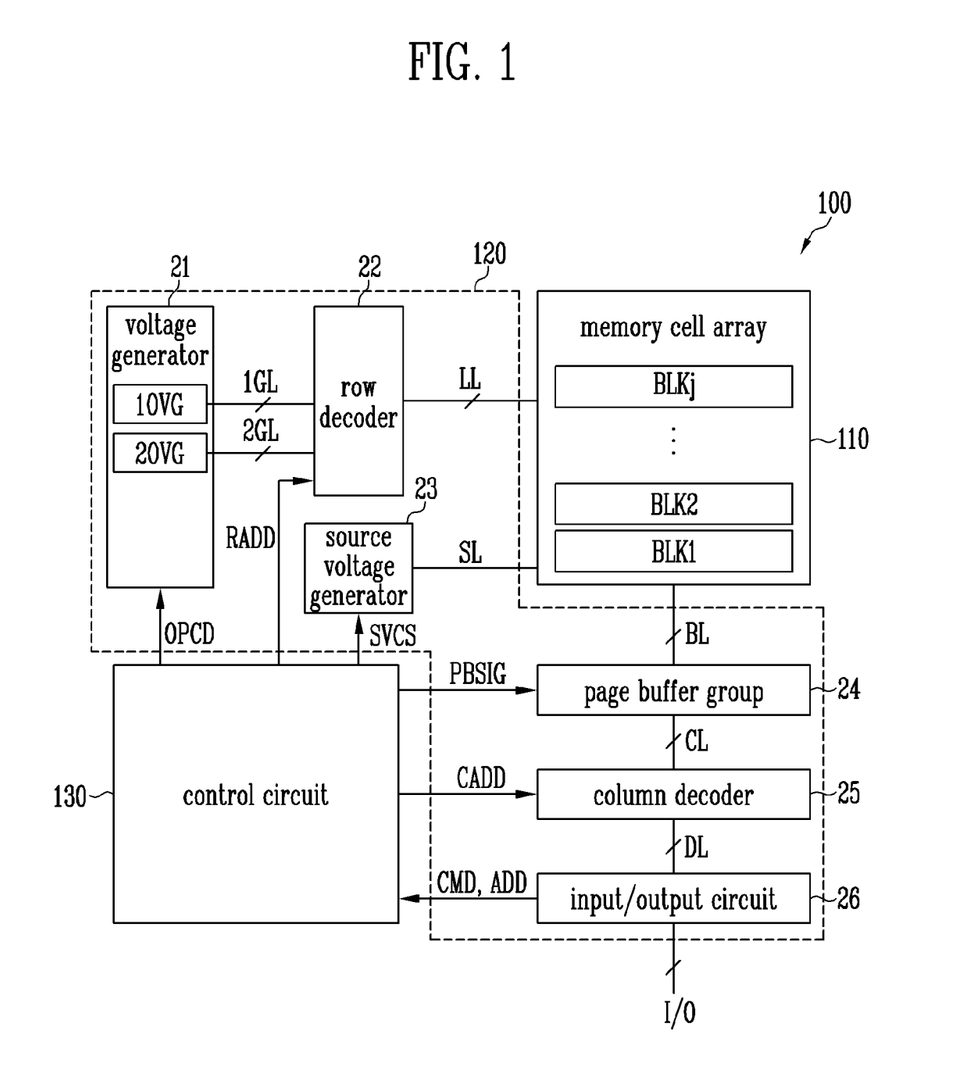
FIG. 1 is a diagram illustrating a memory device.

FIG. 1 is a diagram illustrating a memory device.

Referring to FIG. 1, the memory device 100 may include a memory cell array 110, a peripheral circuit 120, and a control circuit 130.

The memory cell array 110 may include a plurality of memory blocks BLK1 to BLKj. The plurality of memory blocks BLK1 to BLKj may be implemented in a three-dimensional structure. For example, each of the plurality of memory blocks BLK1 to BLKj may include a plurality of memory cells, and the plurality of memory cells may be stacked in a vertical direction above a substrate.

The peripheral circuit 120 may be configured to perform a program operation, a read operation, or an erase operation of the memory cell arrays 110 under the control of the control circuit 130. For example, the peripheral circuit 120 may include a voltage generator 21, a row decoder 22, a source voltage generator 23, a page buffer group 24, a column decoder 25, and an input/output circuit 26.

The voltage generator 21 may be configured to generate various operating voltages by using an internal power voltage supplied to the memory device 100. For example, the voltage generator 21 may generate a program voltage, a pass voltage, a verify voltage, a read voltage, an erase voltage, a turn-on voltage, a turn-off voltage, a ground voltage, and the like. In addition, the voltage generator 21 may generate a positive or negative voltage having various levels. The voltage generator 21 may adjust levels and output times of operating voltages in response to an operation code OPCD. The voltage generator 21 may output operating voltages through first global lines 1GL and second global lines 2GL. For example, the voltage generator 21 may include a first operating voltage generator 1OVG configured to output operating voltages through the first global lines 1GL and a second operating voltage generator 2OVG configured to output operating voltages through the second global lines 2GL. The first operating voltage generator 1OVG and the second operating voltage generator 2OVG may be configured to output different voltages according to the operation code. For example, when voltages to be transmitted to a selected memory block are output from the first operating voltage generator 1OVG, the second operating voltage generator 2OVG may be configured to output the ground voltage or the positive voltage through the second global lines 2GL. Alternatively, when voltages to be transmitted to the selected memory block are output from the second operating voltage generator 2OVG, the first operating voltage generator 1OVG may be configured to output the ground voltage or the positive voltage through the first global lines 1GL.

The row decoder 22 may be configured to receive voltages output from the voltage generator 21 through the first global lines 1GL and the second global lines 2GL and transmit the received voltages to local lines LL. The local lines LL may be connected to each of the plurality of memory blocks BLK1 to BLKj. The row decoder 22 may transfer operating voltages to local lines LL connected to a selected memory block in response to a row address RADD. For example, the row decoder 22 may transfer operating voltages to the local lines LL connected to the selected memory block, and transfer the ground voltage or the positive voltage to local lines LL connected to unselected memory blocks. The row decoder 22 may be configured to increase a voltage of some lines among the local lines LL connected to the unselected memory blocks by using a gate induced drain leakage (GIDL).

The source voltage generator 23 may be configured to generate a source voltage in response to a source voltage control signal SVCS and output the source voltage through a source line SL. The source line SL may be commonly connected to the plurality of memory blocks BLK1 to BLKj, and therefore, the source voltage applied to the source line SL may be commonly transferred to the plurality of memory blocks BLK1 to BLKj.

The page buffer group 24 may be connected to the plurality of memory blocks BLK1 to BLKj through bit lines BL, and be connected to the column decoder 25 through column lines CL. The page buffer group 24 may include page buffers (not shown) configured to be operated in response to a page buffer control signal PBSIG. The page buffers (not shown) may be configured to temporarily store data in a program operation, a read operation, or an erase operation. For example, in the program operation, the page buffer group 24 may temporarily store data received through the column lines CL, and output a program allow voltage or a program inhibit voltage to the bit lines BL according to the temporarily stored data. Also, the page buffer group 24 may determine data by sensing voltages or currents of the bit lines BL in a program verify operation performed in the program operation or an erase verify operation performed in an erase operation. In the read operation, the page buffer group 24 may read data by sensing voltages or currents of the bit lines BL, and output the read data through the column lines CL.

The column decoder 25 may be connected to the page buffer group 24 through the column lines CL, and be connected to the input/output circuit 26 through data lines DL. The column decoder 25 may transmit data by connecting the data lines DL and the column lines CL to each other in response to a column address CADD.

The input/output circuit 26 may be connected to the column decoder 25 through the data lines DL, and be connected to an external device through input/output lines I/O. The external device may be a controller (not shown) which transmits a command CMD, an address ADD, or data to the memory device 100. The input/output circuit 26 may transfer, to the control circuit 130, the command CMD and the address ADD, which are received through the input/output lines I/O, and transfer the data received through the input/output lines I/O to the column decoder 25 through the data lines DL. Alternatively, the input/output circuit 26 may output, through the input/output lines I/O, the data received through the data lines DL.

The control circuit 130 may include software and circuits configured to output the operation code OPCD, the row address RADD, the source voltage control signal SVCS, the page buffer control signal PBSIG, and the column address CADD according to the command CMD and the address ADD. For example, the control circuit 130 may include software which executes a program, read, or erase algorithm in response to the command CMD, and include circuits configured to output various signals according to a selected algorithm in response to the command CMD. A program operation will be described an example. The control circuit 130 may execute a program algorithm in response to a command for the program operation. The control circuit 130 may output the operation code OPCD, the source voltage control signal SVCS, and the page buffer control signal PBSIG according to the program algorithm, and output the row address RADD and the column address CADD according to the address ADD.

Figure 2:
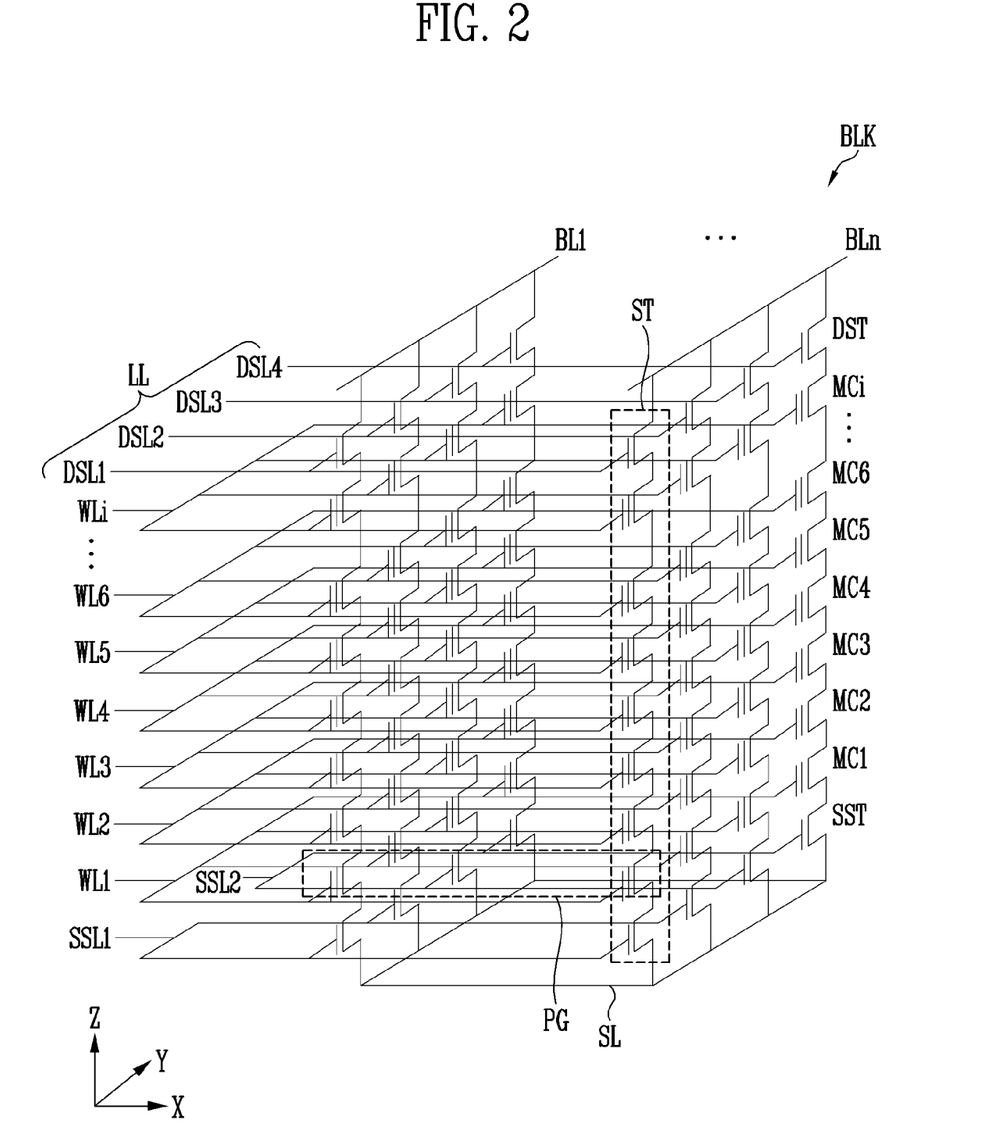
FIG. 2 is a diagram illustrating a memory block.

FIG. 2 is a diagram illustrating a memory block.

Referring to FIG. 2, any one memory block BLK among the plurality of memory blocks BLK1 to BLKj shown in FIG. 1 is illustrated. The memory block BLK may include strings ST connected between first to nth bit lines BL1 to BLn and a source line SL. Each of the strings ST may include a source select transistor SST, memory cells MC1 to MCi, and a drain select transistor DST, which are connected in series to each other. Although one source select transistor SST and one drain select transistor DST are included in each of the strings ST shown in FIG. 2, a plurality of source select transistors SST and a plurality of drain select transistors DST may be included in one string ST.

Gates of source select transistors SST included in different strings ST may be connected to a first or second source select line SSL1 or SSL2. For example, source select transistors SST arranged in an X direction among the source select transistors SST may be connected to the same source select line, and some of source select transistors SST arranged in a Y direction may be connected to different source select lines. For example, first and second source select transistors SST among the source select transistors SST arranged in the Y direction may be connected to the first source select line SSL1, and third and fourth source select transistors SST among the source select transistors SST arranged in the Y direction may be connected to the second source select line SSL2.

Gates of memory cells MC1 to MCi included in different strings ST may be connected to word lines WL1 to WLi. For example, memory cells arranged along an XY plane may be connected to the same word line, and memory cells arranged along a Z direction may be connected to different word lines. For example, first memory cells MC1 arranged along an XY plane may be commonly connected to a first word line WL1, and ith memory cells MCi arranged along an XY plane may be commonly connected to an ith word line WLi.

Gates of drain select transistors DST included in different strings ST may be connected to any one of first to fourth drain select lines DSL1 to DSL4. Gates of drain select transistors DST arranged in the X direction among the drain select transistors DST are commonly connected to the same drain select line, but drain select transistors DST arranged in the Y direction among the drain select transistors DST may be connected to different drain select lines. For example, when drain select transistors SST are sequentially arranged along the Y direction, first drain select transistors may be connected to the first drain select line DSL1, second drain select transistors may be connected to the second drain select line DSL2, third drain select transistors may be connected to the third drain select line DSL3, and fourth drain select transistors may be connected to the fourth drain select line DSL4.

The number of source and drain select lines connected to the memory block BLK is not limited to the number shown in FIG. 2.

In a program or read operation, strings ST connected to a selected drain line in a selected memory block may become selected strings, and strings ST connected to unselected drain select lines in the selected memory block may become unselected strings. For example, when a positive turn-on voltage is applied to the first drain select line DSL1 and a turn-off voltage of OV is applied to the second to fourth drain select lines DSL2 to DSL4, the first drain select line DSL1 may become a selected drain select line, and the second to fourth drain select lines DSL2 to DSL4 may become unselected drain select lines. Therefore, the strings ST connected to the first drain select line DSL1 may become selected strings, and the strings ST connected to the second to fourth drain select lines DSL2 to DSL4 may become unselected strings.

In a program or read operation, the first source select line SSL1 connected to the selected strings, which is selected from the first and second source select lines SSL1 and SSL2, may become a selected source select line, and the second source select line SSL2 connected to the unselected strings, which is selected from the first and second source select lines SSL1 and SSL2, may become an unselected source select line. Therefore, the selected strings and some of the unselected strings may be connected to the selected source line, and only the unselected strings may be connected to the unselected source select line.

Memory cells connected to the same word line may constitute one page PG. The page means a physical page. For example, memory cells arranged along the X direction among the first memory cells MC1 connected to the first word line WL1 may constitute one page PG. Therefore, a plurality of pages may be connected to each of first to ith word lines WL1 to WLi.

A program or read operation may be performed in a selected page. The selected page may be determined by a selected word line and a selected drain select line. For example, in the program operation, when the first word line WL1 is the selected word line and the first drain select line DSL1 is the selected drain select line, memory cells included in strings connected to the first drain select line DSL1 among the memory cells connected to the first word line WL1 may constitute the selected page.

The memory cells may be programmed in various manners. For example, the program operation may be divided into a single-level cell manner or a multi-level cell manner according to the number of bits of data stored in one memory cell. The single-level cell manner may be a manner in which 1-bit data is stored in one memory cell, and the multi-level cell manner may be a manner in which 2-bit data is stored in one memory cell. In addition, the program operation may be divided into a triple-level cell manner in which 3-bit data is stored in one memory cell and a quad-level cell manner in which 4-bit data is stored in one memory cell. In addition, the program operation may be performed in various manners in which 5-or-more-bit data is stored in one memory cells.

Figure 3:
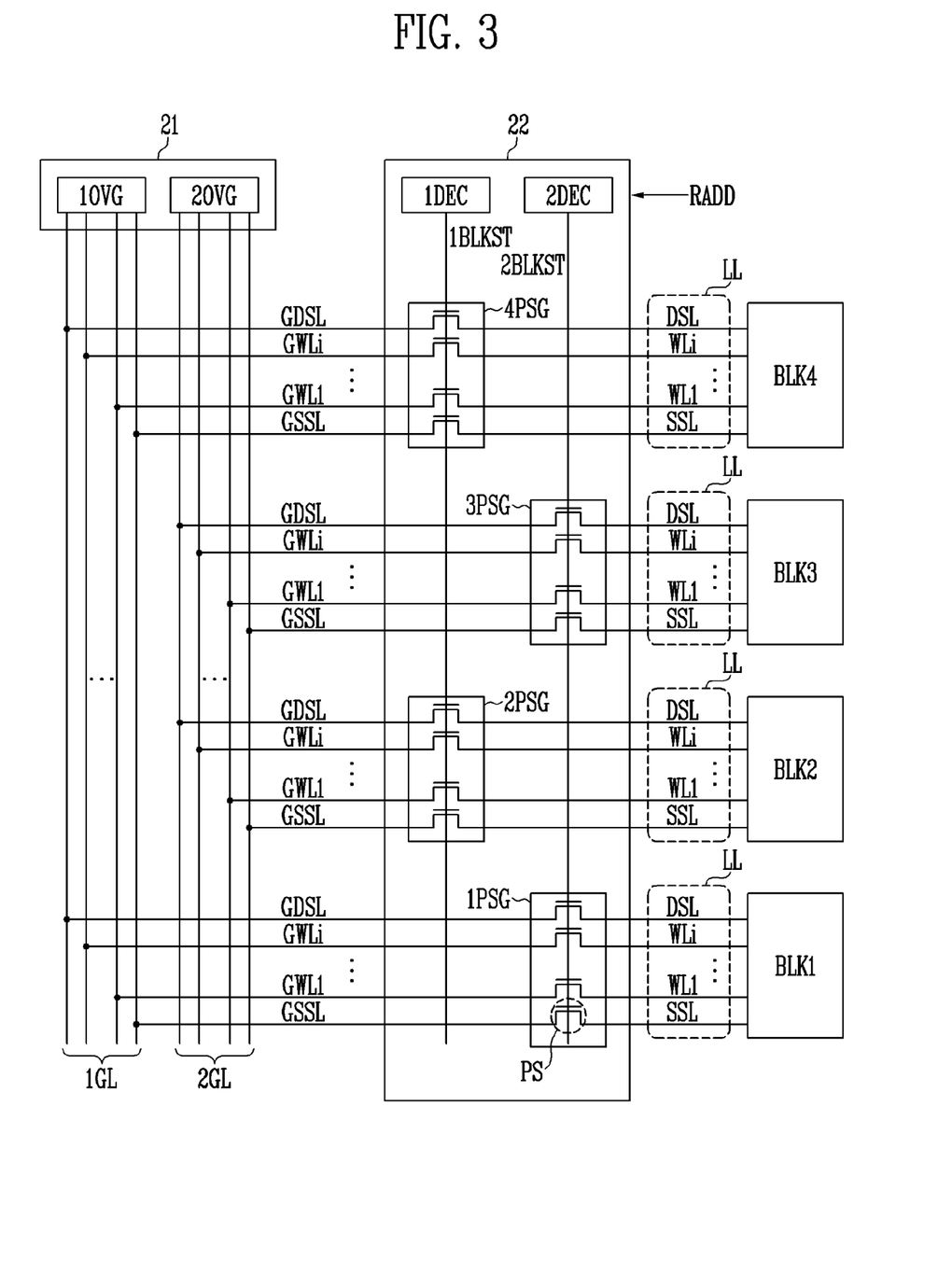
FIG. 3 is a diagram illustrating a voltage generator and a row decoder.

FIG. 3 is a diagram illustrating a voltage generator and a row decoder.

Referring to FIG. 3, the voltage generator 21 may include a first operating voltage generator 1OVG and a second operating voltage generator 2OVG. The first operating voltage generator 1OVG or the second operating voltage generator 2OVG may generate operating voltages used for a program, read, or erase operation, and the operating voltages may be output through first global lines 1GL or second global lines 2GL. When the first operating voltage generator 1OVG outputs operating voltages to be applied to a selected memory block, the second operating voltage generator 2OVG may output a ground voltage or a positive voltage. When the second operating voltage generator 2OVG outputs operating voltages to be applied to the selected memory block, the first operating voltage generator 1OVG may output the ground voltage or the positive voltage.

The first global lines 1GL may include a global drain select line GDSL, first to ith global word lines GWL1 to GWLi, and a global source select line GSSL. The second global lines 2GL may also include a global drain select line GDSL, first to ith global word lines GWL1 to GWLi, and a global source select line GSSL.

The row decoder 22 may include a first decoder 1DEC, a second decoder 2DEC, and first to fourth pass switch groups 1PSG to 4PSG. Each of the first to fourth pass switch groups 1PSG to 4PSG may include pass switches PS connected in parallel to each other. Because the pass switches PS are to transfer a high voltage such as a program voltage, the pass switches PS may be implemented with a high voltage transistor. For example, the pass switches PS may be implemented with a high voltage NMOS transistor. The first and second decoders 1DEC and 2DEC may determine levels of first and second block select signals 1BLKST and 2BLKST in response to a row address RADD.

The first decoder 1DEC may be configured to output the first block select signal 1BLKST commonly applied to the second and fourth pass switch groups 2PSG and 4PSG. The second decoder 2DEC may be configured to output the second block select signal 2BLKST commonly applied to the first and third pass switch groups 1PSG and 3PSG.

The first pass switch group 1PSG may be configured to connect or block the first global lines 1GL to or from local lines LL connected to a first memory block BLK1 in response to the second block select signal 2BLKST output from the second decoder 2DEC. The second pass switch group 2PSG may be configured to connect or block the second global lines 2GL to or from local lines LL connected to a second memory block BLK2 in response to the first block select signal 1BLKST output from the first decoder 1DEC. The third pass switch group 3PSG configured to connect or block the second global lines 2GL to or from local lines LL connected to a third memory block BLK3 in response to the second block select signal output from the second decoder 2DEC. The fourth pass switch group 4PSG may be configured to connect or block the first global lines 1GL to or from local lines LL connected to a fourth memory block BLK4 in response to the first block select signal 1BLKST output from the first decoder 1DEC.

The first to fourth pass switch groups 1PSG to 4PSG are configured similarly to one another, and therefore, the first pass switch group 1PSG will be described in detail as follows.

The first pass switch group 1PSG may be turned on when the second block select signal 2BLKST is a high voltage, and be turned off when the second block select signal 2BLKST is the ground voltage. The high voltage is a positive voltage higher than 0V, and may have a level higher than a level of the program voltage. For example, the high voltage may be set to a level obtained by adding up a threshold voltage at which the pass switch PS is turned on and the program voltage.

When the second block select signal 2BLKST is a high voltage, the pass switches PS included in the first pass switch group 1PSG are turned on, and therefore, the global drain select line GDSL, the first to ith global word lines GWL1 to GWLi, and the global source select line GSSL, which are included in the first global lines 1GL, may be connected to a drain select line DSL, first to ith word lines WL1 to WLi, and a source select line SSL, which are connected to the first memory block BLK1. Accordingly, operating voltages applied to the first global lines 1GL can be transferred to the first memory block BLK1 through the first pass switch group 1PSG.

When the second block select signal 2BLKST is the ground voltage, the pass switches PS included in the first pass switch group 1PSG are turned off, and therefore, the local lines LL connected to the first memory block BLK1 may be floated.

When the second block select signal 2BLKST is a negative voltage lower than the ground voltage, the pass switches PS may be turned off. Although a GIDL occurs in some of the pass switches PS as the level of the negative voltage is increased, voltages applied to the global drain and global source select lines GDSL and GSSL are not transferred to the drain and source select lines DSL and SSL.

Figure 4A:
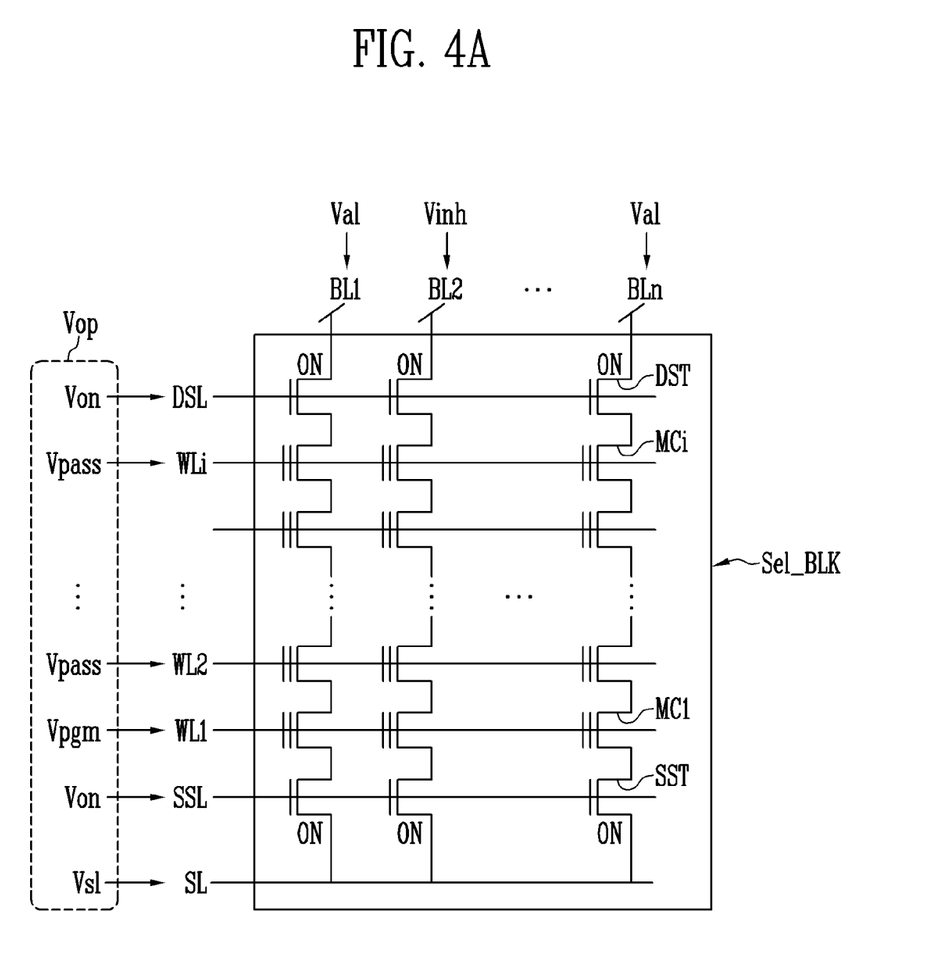
FIGS. 4A and 4B are diagrams illustrating select transistors of a selected memory block and an unselected memory block in a program operation.
Figure 4B:
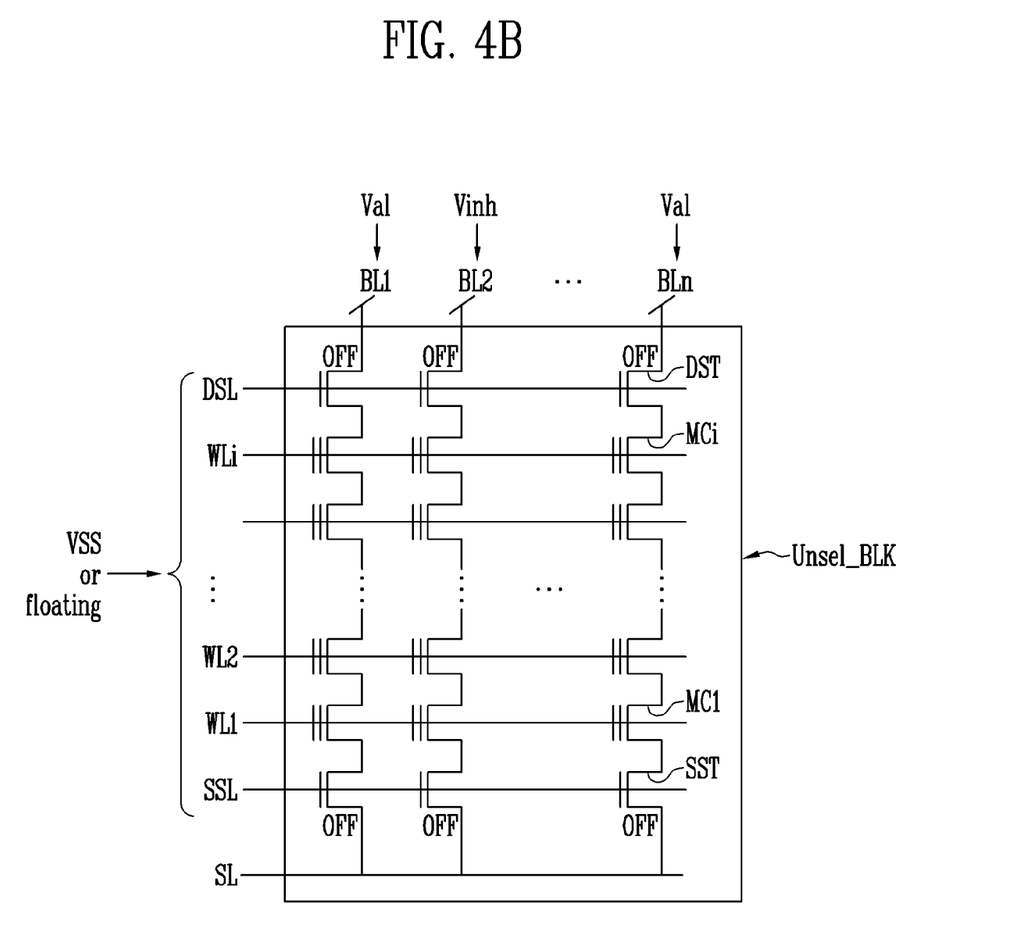

FIGS. 4A and 4B are diagrams illustrating select transistors of a selected memory block and an unselected memory block in a program operation. FIG. 4A illustrates the selected memory block, and FIG. 4B illustrates the unselected memory block.

Referring to FIGS. 4A and 4B, a turn-on voltage Von may be applied to a drain select line DSL and a source select line SSL, which are connected to the selected memory block Sel_BLK, a program voltage Vpgm may be applied to a selected word line connected to the selected memory block Sel_BLK, and a pass voltage Vpass may be applied to unselected word lines Unsele_WL connected to the selected memory block Sel_BLK. A source voltage Vsl having a positive voltage may be applied to a source line SL connected to the selected memory block Sel_BLK, and a program allow voltage Val or a program inhibit voltage Vinh may be applied to first to nth bit lines BL1 to BLn connected to the selected memory block Sel_BLK. The program allow voltage Val may be set as a ground voltage or 0V, and the program inhibit voltage Vinh may be set as a positive voltage. Because the first to nth bit lines BL1 to BLn are to be electrically connected to strings in the selected memory block Sel_BLK, the turn-on voltage Von having a positive voltage may be applied to the drain select line DSL, and drain select transistors DST may be turned on (ON) by the turn-on voltage Von. The source voltage Vsl having a positive voltage may be applied to the source line SL, but the ground voltage may be applied to the source line SL according to a program operation. Because the turn-on voltage Von is applied to the source select line SSL, source select transistors SST may also be turned on (ON). When assuming that a first word line WL1 is the selected word line, the other second to ith word lines WL2 to WLi become the unselected word lines. The program voltage Vpgm may be applied to the first word line WL1 as the selected word line, and the pass voltage Vpass may be applied to the second to ith word lines WL2 to WLi as the unselected word lines.

The first to nth bit lines BL1 to BLn are commonly connected to the selected memory block Sel_BLK and the unselected memory block Unsel_BLK. Therefore, to prevent channel boosting from occurring in the unselected memory block Unsel_BLK, drain select transistors DST and source select transistors SST, which are included in the unselected memory block Unsel_BLK, are to be turned off (OFF). To turn off the drain select transistors DST and the source select transistors SST, the ground voltage may be applied to a drain select line DSL, a source select line SSL, and first to ith word lines WL1 to WLi, which are connected to the unselected memory block Unsel_BLK, or the drain select line DSL, the source select line SSL, and the first to ith word lines WL1 to WLi may be floated.

However, when the ground voltage VSS is applied to the drain select line DSL or the source select line SSL, a leakage current may be generated at the drain select transistor DST or the source select transistor SST due to a voltage difference between a drain and a gate or a voltage difference between a source and the gate. When the leakage current is generated at the drain select transistor DST or the source select transistor SST, a positive voltage applied to bit lines or the source line SL is introduced into strings, and therefore, channel boosting may occur.

The reason why the leakage current is generated at the drain select transistor DST or the source select transistor SST will be described in detail as follows.

Figure 5A:
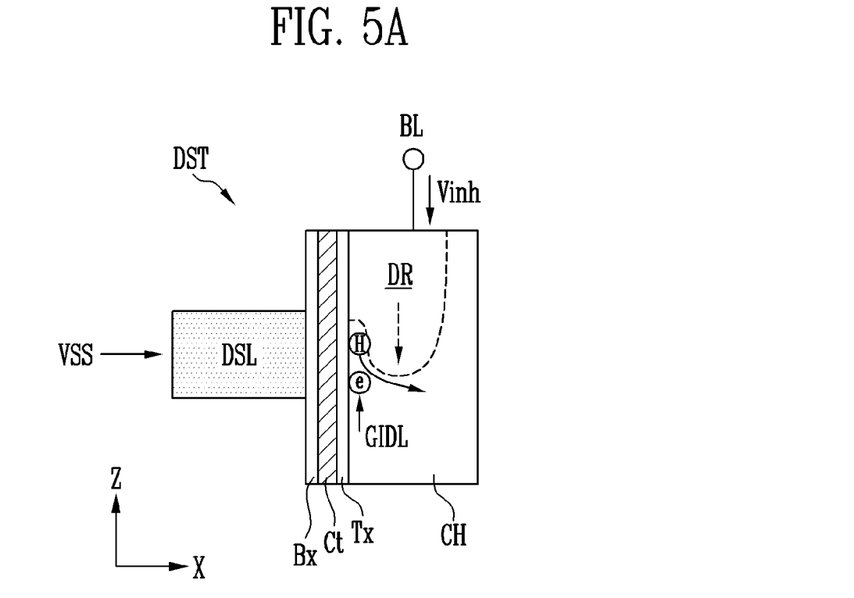
FIGS. 5A and 5B are diagrams illustrating a gate induced drain leakage (GIDL) which may occur in an unselected memory block.
Figure 5B:
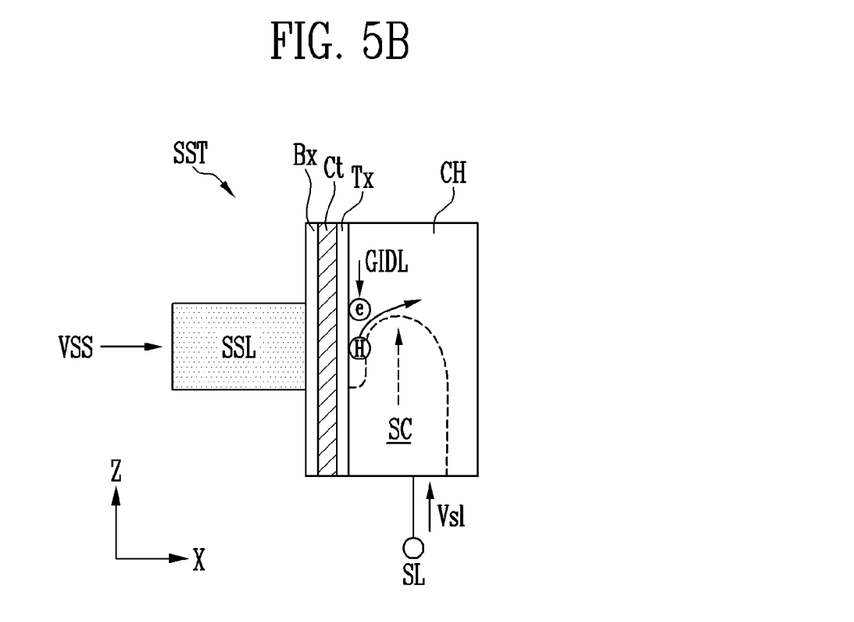

FIGS. 5A and 5B are diagrams illustrating a gate induced drain leakage (GIDL) which may occur in an unselected memory block. FIG. 5A is a diagram illustrating a GIDL which may occur at a drain select transistor DST, and FIG. 5B is a diagram illustrating a GIDL which may occur at a source select transistor SST.

Referring to FIG. 5A, the drain select transistor DST may include a channel layer CH, a tunnel insulating layer Tx, a charge trap layer Ct, a blocking layer Bx, and a drain select line DSL. When the memory device is implemented in a three-dimensional structure, the channel layer CH may be formed of poly-crystalline silicon. The tunnel insulating layer Tx and the blocking layer Bx may be formed of an insulating material. For example, the tunnel insulating layer Tx and the blocking layer Bx may be formed of an oxide layer or a silicon oxide layer. The charge trap layer Ct may be formed of a nitride layer. The drain select line DSL may be formed of a conductive material. For example, the drain select line DSL may be formed of a conductive material such as tungsten (W), molybdenum (Mo), cobalt (Co), or nickel (Ni).

A drain DR of the drain select transistor DST may be connected to a bit line BL. When a program inhibit voltage Vinh as a positive voltage is applied to the bit line BL and a ground voltage VSS is applied to the drain select line DSL, a drain DR region may expand to a region adjacent to the drain select line DSL due to a voltage difference between the drain DR and the drain select line DSL. Therefore, a GIDL may occur while holes H escape from the channel layer CH between the drain DR and the tunnel insulating layer Tx, and then electrons e move to a region in which the holes H escape. When the GIDL occurs, a leakage current is generated at the drain select transistor DST which is to be maintained in a turn-off state, and hence the program inhibit voltage Vinh applied to the bit line BL may be gradually introduced into the channel layer CH. Therefore, channel boosting may occur in the channel layer CH.

Referring to FIG. 5B, the source select transistor SST is implemented in the same structure as the drain select transistor DST, and therefore, descriptions of the structure of the source select transistor SST will be omitted.

A source SC of the source select transistor SST may be connected to a source line SL. When a source voltage Vsl as a positive voltage is applied to the source line SL and the ground voltage VSS is applied to a source select line SSL, a source SC region may expand to a region adjacent to the source select line SSL due to a voltage difference between the source SC and the source select line SSL. Therefore, a GIDL may occur while holes H escape from the channel layer CH between the source SC and the tunnel insulating layer Tx, and then electrons e move to a region in which the holes H escape. When the GIDL occurs, a leakage current is generated at the source select transistor SST which is to be maintained in the turn-off state, and hence the source voltage Vsl applied to the source line SL may be gradually introduced into the channel layer CH. Therefore, channel boosting may occur in the channel layer CH.

In the following embodiment, an operating method for preventing a GIDL from occurring in drain select transistors DST or source select transistors SST, which are included in unselected memory blocks, is disclosed.

Figure 6:
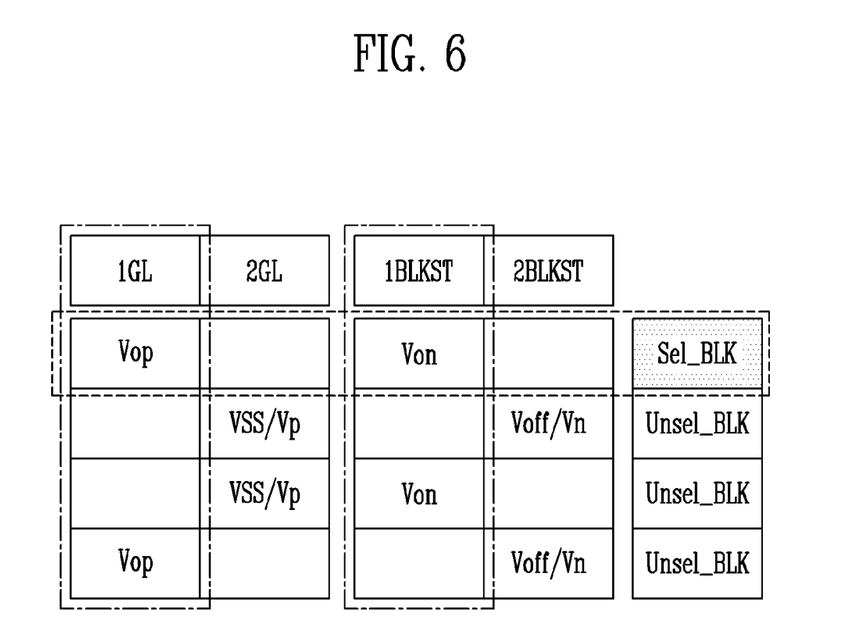
FIG. 6 is a diagram illustrating voltages used for a program operation in accordance with the present disclosure.

FIG. 6 is a diagram illustrating voltages used for a program operation in accordance with the present disclosure.

Referring to FIGS. 3 and 6, in a program operation of the selected memory block Sel_BLK, a voltage of global lines corresponding to the unselected memory blocks Unsel_BLK and a voltage of a block select signal may be adjusted.

It is assumed that the fourth memory block BLK4 among the first to fourth memory blocks BLK1 to BLK4 is the selected memory block Sel_BLK, and the first to third memory blocks BLK1 to BLK3 are the unselected memory blocks Unsel_BLK.

Because operating voltages Vop applied to the selected memory block Sel_BLK are applied to the selected memory block Sel_BLK through the first global lines 1GL and the fourth pass switch group 4PSG, the first operating voltage generator 1OVG may generate the operating voltages Vop, and the first decoder 1DEC may output the first block select signal 1BLKST having a high voltage.

Among the unselected memory blocks Unsel_BLK, the first memory block BLK1 corresponds to the first pass switch group 1PSG and the first global lines 1GL, the second memory block BLK2 corresponds to the second pass switch group 2PSG and the second global lines 2GL, and the third memory block BLK3 correspond to the third pass switch group 3PSG and the second global lines 2GL.

During the program operation of the selected memory block Sel_BLK, the ground voltage VSS is applied to the second global lines 2GL, but a positive voltage Vp may be applied to some global lines in a partial period of the program operation. For example, the second operating voltage generator 2OVG may apply the positive voltage Vp to the global drain select line GDSL and the global source select line GSSL in the partial period of the program operation. The reason why the positive voltage Vp is applied to the global drain select line GDSL and the global source select line GSSL is that the positive voltage is transferred to the drain select line DSL and the source select line SSL, which are connected to the unselected memory blocks Unsel_BLK, so that a GIDL can be prevented from occurring in the drain select transistors and the source select transistors. To transfer the positive voltage Vp applied to the second global lines 2GL to the unselected memory blocks Unsel_BLK, the second decoder 2DEC may output the second block select signal 2BLKST having a negative voltage Vn in a partial period of the program operation.

Among the unselected memory blocks Unsel_BLK, the first memory block BLK1 may be influenced by the voltages applied to the first global lines 1GL and the voltage of the second block select signal 2BLKST, the second memory block BLK2 may be influenced by the voltages applied to the second global lines 2GL and the voltage of the first block select signal 1BLKST, and the third memory block BLK3 may be influenced by the voltages applied to the second global lines 2GL and the voltage of the second block select signal 2BLKST.

A period in which the voltages applied to the second global lines 2GL are changed from the ground voltage VSS to the positive voltage Vp and a period in which the second block select signal 2BLKST is changed from the ground voltage VSS to the negative voltage Vn may be equal to each other. For example, when the pass voltage or the program voltage is applied to the word lines, the pass voltage or the program voltage may be changed from the ground voltage VSS to the positive Vp or the negative voltage Vn.

In the program operation, a method of changing the voltages applied to each of the lines and the voltage of the block select signal will be described in detail as follows.

Figure 7:
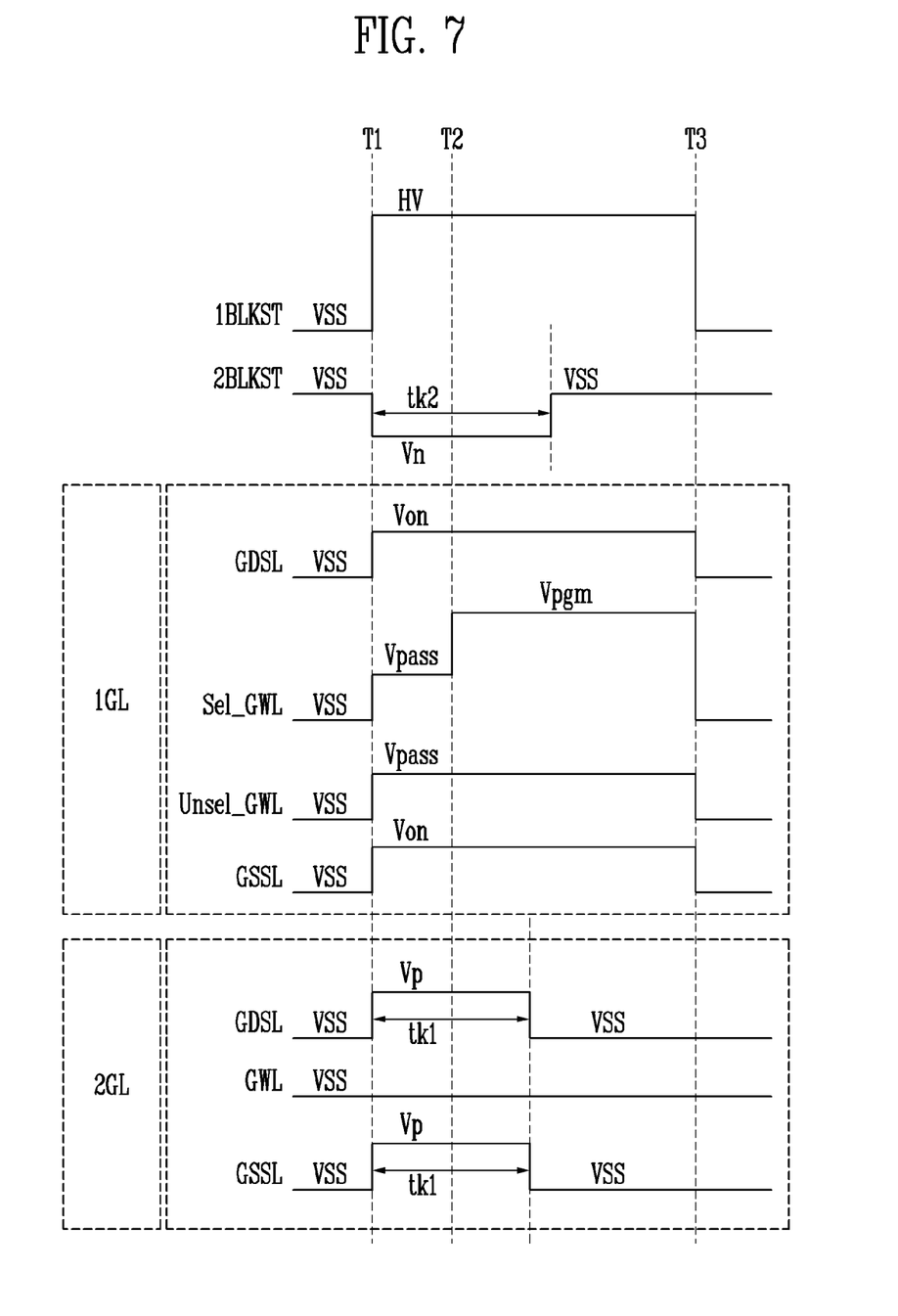
FIG. 7 is a diagram illustrating a program operation in accordance with the present disclosure.
Figure 8A:
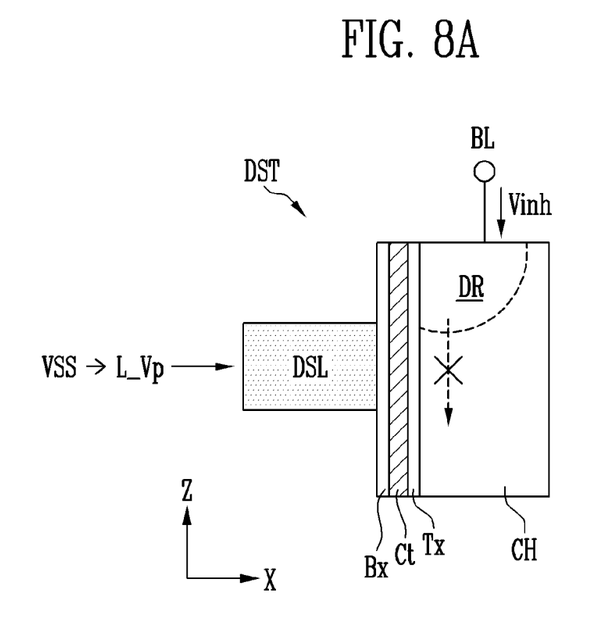
FIGS. 8A and 8B are diagrams illustrating an operation of select transistors in accordance with the present disclosure.
Figure 8B:
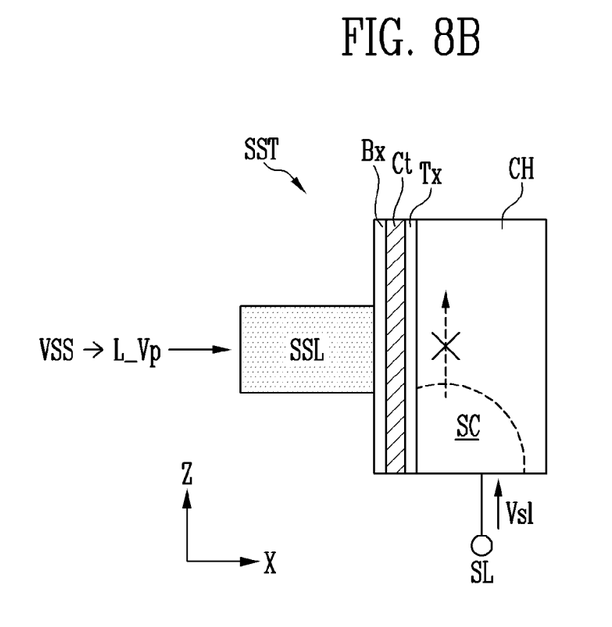

FIG. 7 is a diagram illustrating a program operation in accordance with the present disclosure. FIGS. 8A and 8B are diagrams illustrating an operation of select transistors in accordance with the present disclosure.

Referring to FIGS. 6 and 7, in a pass voltage applying period T1 to T2, the turn-on voltage Von set as a positive voltage may be applied to the global drain select line GDSL and the global source select line GSSL, which are included in the first global lines 1GL, and the pass voltage Vpass may be applied to a selected global word line Sel_GWL and unselected global word lines Unsel_GWL. To transfer the operating voltages Vop applied to the first global lines 1GL to the selected memory block Sel_BLK, the first block select signal 1BLKST may have a high voltage HV. The high voltage HV may be set as a voltage obtained by adding up the program voltage Vpgm to a threshold voltage of at least the pass switch. The ground voltage VSS may be applied to the global word lines GWL included in the second global lines 2GL, and the ground voltage VSS or the positive voltage Vp may be applied to the global drain select line GDSL and the global source select line GSSL. The second block select signal 2BLKST may have the ground voltage VSS.

In a program voltage applying period T2 to T3, the program voltage Vpgm may be applied to the selected global word line Sel_GWL included in the first global lines 1GL. Because the first block select signal 1BLKST has the high voltage HV, the program voltage Vpgm applied to the selected global word line Sel_GWL may be transferred to a selected word line connected to the selected memory block Sel_BLK.

Referring to FIG. 8A, when the voltage of the drain select line DSL is increased from the ground voltage VSS to a low positive voltage L_Vp, the voltage difference between the gate and the drain DR of the drain select transistor DST may decrease. For example, if the voltage of the drain select line DSL is increased to the low positive voltage L_Vp when the program inhibit voltage Vinh is applied to the bit line BL, the voltage difference between the drain DR and the gate may decrease. Therefore, a phenomenon in which the drain DR region of the drain select transistor DST expands does not occur, and no channel is formed in the channel layer CH. Accordingly, the drain select transistor DST may be turned off.

Referring to FIG. 8B, when the voltage of the source select line SSL is increased from the ground voltage VSS to the low positive voltage L_Vp, the voltage difference between the gate and the source SC of the source select transistor SST may decrease. For example, if the voltage of the source select line SSL is increased to the low positive voltage L_Vp when the source voltage Vsl is applied to the source line SL, the voltage difference between the source SC and the gate may decrease. Therefore, a phenomenon in which the source SC region of the source select transistor SST expands does not occur, and no channel is formed in the channel layer CH. Accordingly, the source select transistor SST may be turned off.

As described above, the drain select transistors DST and the source select transistors DST of the unselected memory blocks maintain the turn-off state, so that the phenomenon in which channel boosting occurs in the strings of the unselected memory blocks can be prevented.

Referring to FIGS. 6 and 7, after the positive voltage Vp is applied to the global drain select line GDSL and the global source select line GSSL for a first time tk1, the ground voltage VSS may be again applied to the global drain select line GDSL and the global source select line GSSL. After the second block select signal 2BLKST maintains the negative voltage Vn for a second time tk2, the second block select signal 2BLKST may be again increased to the ground voltage VSS.

Figure 9:
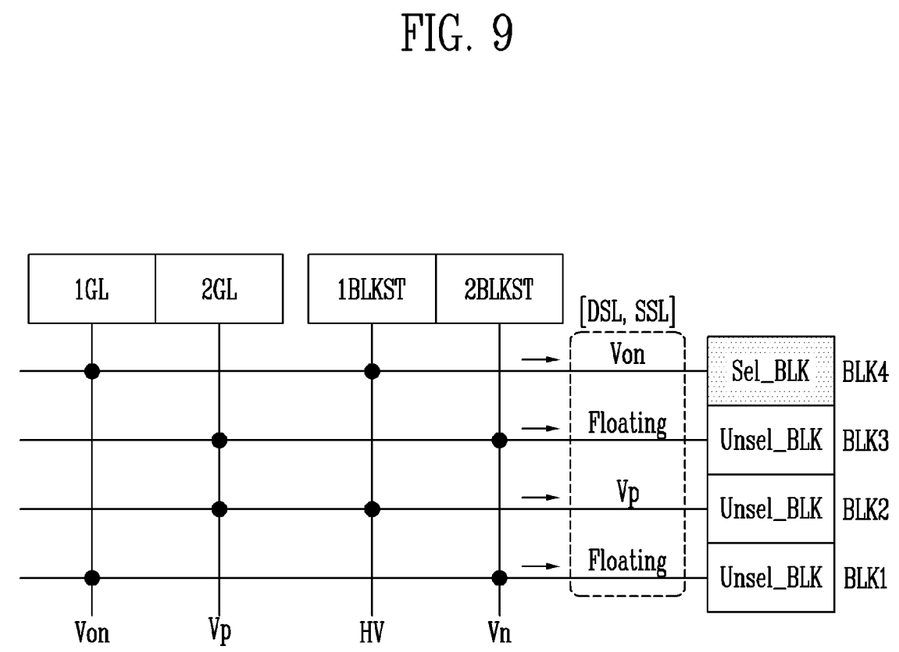
FIG. 9 is a diagram illustrating a voltage of select lines in a voltage change period in accordance with the present disclosure.

FIG. 9 is a diagram illustrating a voltage of select lines in a voltage change period in accordance with the present disclosure.

FIG. 9 is a diagram briefly illustrating the diagram shown in FIG. 3. Therefore, a detailed circuit of a plurality of lines and pass switch groups is omitted, and a connection relationship between components is illustrated.

Referring to FIG. 9, for the first or second time tk1 or tk2 shown in FIG. 7, different voltages may be applied to the drain select lines DSL and the source select lines SSL, which are connected to the selected memory block Sel_BLK or the unselected memory blocks Unsel_BLK.

The drain and source select lines DSL and SSL connected to the fourth memory block BLK4 as the selected memory block Sel_BLK may be influenced by the voltage applied to the first global lines 1GL and the voltage of the first block select signal 1BLKST. For example, the turn-on voltage Von is applied to the global drain and global source lines included in the first global lines 1GL, and the first block select signal 1BLKST has the high voltage HV. Therefore, the turn-on voltage Von applied to the global drain and global source lines may be transferred to the drain and source select lines DSL and SSL of the selected memory block Sel_BLK.

The drain and source select lines DSL and SSL connected to the third memory block BLK3 as the unselected memory block Unsel_BLK may be influenced by the voltage applied to the second global lines 2GL and the voltage of the second block select signal 2BLKST. For example, the positive voltage Vp is applied to the global drain and global source lines included in the second global lines 2GL, and the second block select signal 2BLKST has the negative voltage Vn. Therefore, the drain and source select lines DSL and SSL of the third memory block BLK3 may be floated (Floating).

The drain and source select lines DSL and SSL connected to the second memory block BLK2 as the unselected memory block Unsel_BLK may be influenced by the voltage applied to the second global lines 2GL and the voltage of the first block select signal 1BLKST. For example, the positive voltage Vp is applied to the global drain and global source lines included in the second global lines 2GL, and the first block select signal 1BLKST has the high voltage HV. Therefore, the positive voltage Vp applied to the global drain and global source lines may be transferred to the drain and source lines DSL and SSL of the second memory block BLK2.

The drain and source select lines DSL and SSL connected to the first memory block BLK1 as the unselected memory block Unsel_BLK may be influenced by the voltage applied to the first global lines 1GL and the voltage of the second block select signal 2BLKST. For example, the turn-on voltage Von is applied to the global drain and global source lines included in the first global lines 1GL, and the second block select signal 2BLKST has the negative voltage Vn. Therefore, the drain and source select lines DSL and SSL of the first memory block BLK1 may be floated (Floating).

As described above, in the program operation of the selected memory block, the drain select transistors and the source select transistors, which are included in the unselected memory blocks, maintain the turn-off state, so that the phenomenon in which the channel boosting occurs in the strings of the unselected memory blocks can be prevented. Thus, when a subsequent operation is performed in the unselected memory blocks after the program operation of the selected memory block is ended, the time taken to initialize the channel of the unselected memory blocks can be shortened. In addition, because no residual channel voltage exists, the reliability of the subsequent operation performed in the unselected memory blocks can be improved.

In accordance with some embodiments of the present disclosure, channel boosting can be suppressed in unselected memory blocks during a program operation of a selected memory block, so that the reliability of a subsequent operation which may be performed in the unselected memory blocks can be improved.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed and/or some of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, embodiments of the present disclosure have been illustrated and described in the drawings and specification. Although specific terminologies are used, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
    a first memory block and a second memory block each including a plurality of memory cells;
    a voltage generator configured to apply operating voltages to first global lines, selectively apply a positive voltage to global select lines included in second global lines while the operating voltages are applied, and apply a ground voltage to the second global lines except the global select lines included in the second global lines; and
    a row decoder configured to turn on first pass switches between first local lines connected to the first memory block and the first global lines and configured to turn off second pass switches between second local lines connected to the second memory block and the second global lines.

2. The memory device of claim 1, wherein the voltage generator includes:
    a first operating voltage generator configured to apply the operating voltages, the ground voltage, or the positive voltage to the first global lines; and
    a second operating voltage generator configured to apply the operating voltages, the ground voltage, or the positive voltage to the second global lines.

3. The memory device of claim 2, wherein the second operating voltage generator is configured to apply the ground voltage to the second global lines when the first operating voltage generator applies the operating voltage to the first global lines, and
    wherein the second operating voltage generator is configured to apply the positive voltage to the global select lines included in the second global lines in a period in which the first operating voltage generator applies a program voltage to a selected global word line among the first global lines.

4. The memory device of claim 3, wherein the second operating voltage generator is configured to apply, while the program voltage is applied to the selected global word line among the first global lines, the positive voltage to the global select lines for a certain time and then apply the ground voltage to the global select lines.

5. The memory device of claim 1, wherein the operating voltages include a program voltage, a pass voltage, and a turn-on voltage.

6. The memory device of claim 1, wherein the row decoder further includes:
    a first decoder configured to output a first block select signal for simultaneously controlling the first pass switches in response to a row address; and
    a second decoder configured to output a second block select signal for simultaneously controlling the second pass switches in response to the row address.

7. The memory device of claim 6, wherein the first pass switches are respectively connected between the first global lines and the first local lines,
    wherein the first global lines are comprised of global select lines and global word lines, and
    wherein the first local lines are comprised of local select lines and local word lines.

8. The memory device of claim 7, wherein the local select lines are connected to gates of select transistors of the first memory block, and
    wherein the local word lines are connected to gates of memory cells between the select transistors.

9. The memory device of claim 6, wherein the second pass switches are respectively connected between the second global lines and the second local lines,
    wherein the second global lines are comprised of global select lines and global word lines, and wherein the second local lines are comprised of local select lines and local word lines.

10. The memory device of claim 9, wherein the local select lines are connected to gates of select transistors of the second memory block, and
   wherein the local word lines are connected to gates of memory cells between the select transistors.

11. The memory device of claim 6, wherein the first decoder is configured to output the first block select signal as a high voltage to turn on the first pass switches.

12. The memory device of claim 11, wherein the high voltage is set as a first voltage obtained by adding up a threshold voltage of the first pass switches and a program voltage or a second voltage higher than the first voltage obtained by adding up the threshold voltage of the first pass switches and the program voltage.

13. The memory device of claim 6, wherein the second decoder is configured to output the second block select signal as a negative voltage to turn off the second pass switches.

14. A memory device comprising:
   a first memory block and a second memory block each including a plurality of memory cells;
   a voltage generator configured to apply operating voltages to first global lines, selectively apply a positive voltage to global select lines included in second global lines while the operating voltages are applied, and apply a ground voltage to the second global lines except the global select lines included in the second global lines; and
   a row decoder configured to apply a first block select signal having a high voltage to first pass switches between first local lines connected to the first memory block and the first global lines, and selectively apply a negative voltage to second pass switches between second local lines connected to the second memory block and the second global lines.

15. The memory device of claim 14, wherein the voltage generator is configured to apply a ground voltage to the second global lines while the operating voltages are applied to the first global lines, and
   wherein the voltage generator is configured to apply the positive voltage to the global select lines included in the second global lines when a program voltage is included in the operating voltage.

16. The memory device of claim 14, wherein the row decoder is configured to apply the negative voltage to the second pass switches while the voltage generator applies the positive voltage to the global select lines included in the second global lines.

17. A method of operating a memory device, the method comprising:
   turning on first pass switches between first local lines connected to a first memory block and first global lines;
   turning off second pass switches between second local lines connected to a second memory block and second global lines;
   applying a program voltage to a selected global word line among the first global lines;
   applying a positive voltage to global select lines included in the second global lines, when the program voltage is applied to the selected global word line; and
   applying a negative voltage to gates of the second pass switches, when the program voltage is applied to the selected global word line.

18. The method of claim 17, wherein, in the turning on of the first pass switches, a first block select signal having a high voltage is applied to gates of the first pass switches.

19. The method of claim 18, wherein the high voltage is set as a first voltage obtained by adding up a threshold voltage of the first pass switches and the program voltage or a second voltage higher than the first voltage obtained by adding up the threshold voltage of the first pass switches and the program voltage.

20. The method of claim 17, wherein, in the turning off of the second pass switches, a second block select signal having a ground voltage is applied to the gates of the second pass switches.

21. The method of claim 17, wherein applying the negative voltage to the gates of the second pass switches is performed while applying the program voltage to the selected global word line among the first global lines.

22. The method of claim 21, wherein applying the positive voltage to the global select lines included in the second global lines is performed while applying of the negative voltage to the gates of the second pass switches.

23. The method of claim 17, further comprising applying a ground voltage to the second global lines before applying the positive voltage to the global select lines among the second global lines.

24. The method of claim 17, wherein the second pass switches are turned off between local select lines connected to select transistors of the second memory block and the global select lines, and
   wherein the local select lines are included in the second local lines.

* * * * *